(12) United States Patent
Kimizuka et al.

(10) Patent No.: US 11,232,929 B2
(45) Date of Patent: Jan. 25, 2022

(54) METHOD FOR DETERMINING IRRADIATION CONDITIONS FOR CHARGED PARTICLE BEAM DEVICE AND CHARGED PARTICLE BEAM DEVICE

(71) Applicant: Hitachi High-Tech Corporation, Tokyo (JP)

(72) Inventors: Heita Kimizuka, Tokyo (JP); Natsuki Tsuno, Tokyo (JP); Muneyuki Fukuda, Tokyo (JP); Katsura Takaguchi, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 17/040,141

(22) PCT Filed: Apr. 25, 2018

(86) PCT No.: PCT/JP2018/016741
§ 371 (c)(1),
(2) Date: Sep. 22, 2020

(87) PCT Pub. No.: WO2019/207668
PCT Pub. Date: Oct. 31, 2019

(65) Prior Publication Data
US 2021/0027981 A1 Jan. 28, 2021

(51) Int. Cl.
*H01J 37/22* (2006.01)
*H01J 37/147* (2006.01)
(Continued)

(52) U.S. Cl.
CPC .......... *H01J 37/22* (2013.01); *H01J 37/1474* (2013.01); *H01J 37/244* (2013.01); *H01J 37/28* (2013.01);
(Continued)

(58) Field of Classification Search
CPC .. H01J 37/00; H01J 37/02; H01J 37/22; H01J 37/1474; H01J 37/244; H01J 37/28;
(Continued)

(56) References Cited

U.S. PATENT DOCUMENTS 6,344,750 B1   2/2002  Lo et al.
8,907,279 B2  12/2014  Tsuno et al.
(Continued)

FOREIGN PATENT DOCUMENTS

JP   2000-208085 A   7/2000
JP    2002-9121 A    1/2002
(Continued)

OTHER PUBLICATIONS

International Search Report (PCT/ISA/210) issued in PCT Application No. PCT/JP2018/016741 dated Jul. 3, 2018 with English translation (four (4) pages).
(Continued)

*Primary Examiner* — Jason L McCormack
(74) *Attorney, Agent, or Firm* — Crowell & Moring LLP

(57) ABSTRACT

The purpose of the present disclosure is to propose a charged particle beam device capable of allowing specifying of a distance between irradiation points for a pulsed beam and a time between irradiation points. Proposed is a charged particle beam device equipped with a beam column which has a scanning deflector for sweeping a beam and directs the beam swept by the scanning deflector onto a sample in pulses, wherein: the distance between irradiation points of the pulsed beam is set such that feature quantities of one or more specific regions of an image obtained on the basis of an output of a detector satisfy a predetermined state; the duration of time between irradiation points for the pulsed beam is changed when in a state in which the set distance between irradiation points is set or in a state in which
(Continued)

multiple distances between irradiation points determined on the basis of the specified distance between irradiation points are set; and the beam emission is carried out according to the duration of time between irradiation points whereby the feature quantities of the multiple specific regions of the image obtained on the basis of the output of the detector satisfy the predetermined state.

18 Claims, 18 Drawing Sheets

(51) Int. Cl.
*H01J 37/244* (2006.01)
*H01J 37/28* (2006.01)

(52) U.S. Cl.
CPC .............. *H01J 2237/24578* (2013.01); *H01J 2237/2801* (2013.01)

(58) Field of Classification Search
CPC .......... H01J 37/222; H01J 2237/24578; H01J 2237/2801; H01J 2237/2826; H01J 2237/2803; H01J 2237/0432; H01J 2237/24564
USPC ................................ 250/306, 307, 310, 311
See application file for complete search history.

(56) References Cited

U.S. PATENT DOCUMENTS

| | | | |
|---|---|---|---|
| 9,659,744 B2 | 5/2017 | Tsuno et al. | |
| 9,697,987 B2 | 7/2017 | Yokosuka et al. | |
| 2001/0052781 A1 | 12/2001 | Nozoe et al. | |
| 2008/0116375 A1* | 5/2008 | Ikegami | G01N 23/225 |
| | | | 250/307 |
| 2014/0097342 A1 | 4/2014 | Tsuno et al. | |
| 2014/0131590 A1 | 5/2014 | Shigeto et al. | |
| 2016/0148781 A1* | 5/2016 | Tsuno | H01J 37/244 |
| | | | 250/307 |
| 2016/0240348 A1 | 8/2016 | Yokosuka et al. | |

FOREIGN PATENT DOCUMENTS

| | | | |
|---|---|---|---|
| JP | 2004-266182 A | 9/2004 | |
| JP | 5744629 B2 | 7/2015 | |
| JP | 2016-100153 A | 5/2016 | |
| JP | 6239633 B2 | 11/2017 | |
| WO | WO 2012/165293 A1 | 12/2012 | |
| WO | WO 2013/035220 A1 | 3/2013 | |
| WO | WO 2015/045498 A1 | 4/2015 | |

OTHER PUBLICATIONS

Japanese-language Written Opinion (PCT/ISA/237) issued in PCT Application No. PCT/JP2018/016741 dated Jul. 3, 2018 (three (3) pages).

* cited by examiner

[FIG. 1]
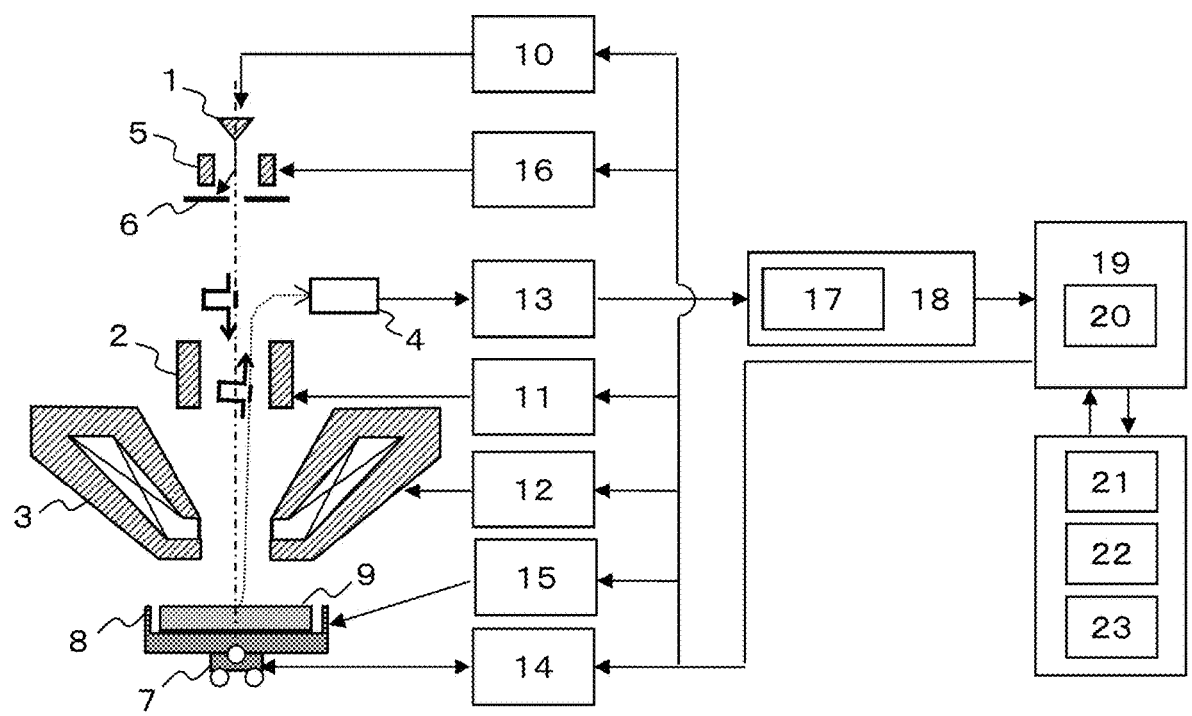

[FIG. 2]
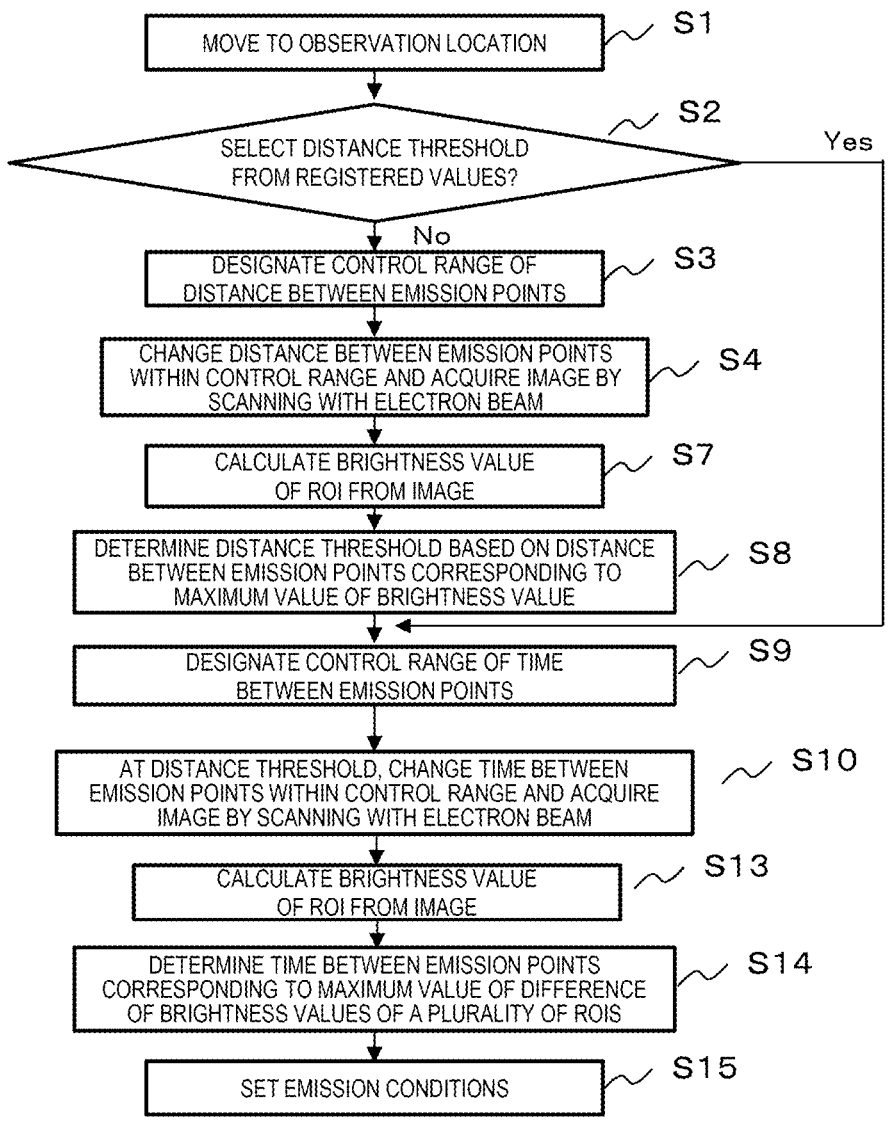

[FIG. 3]
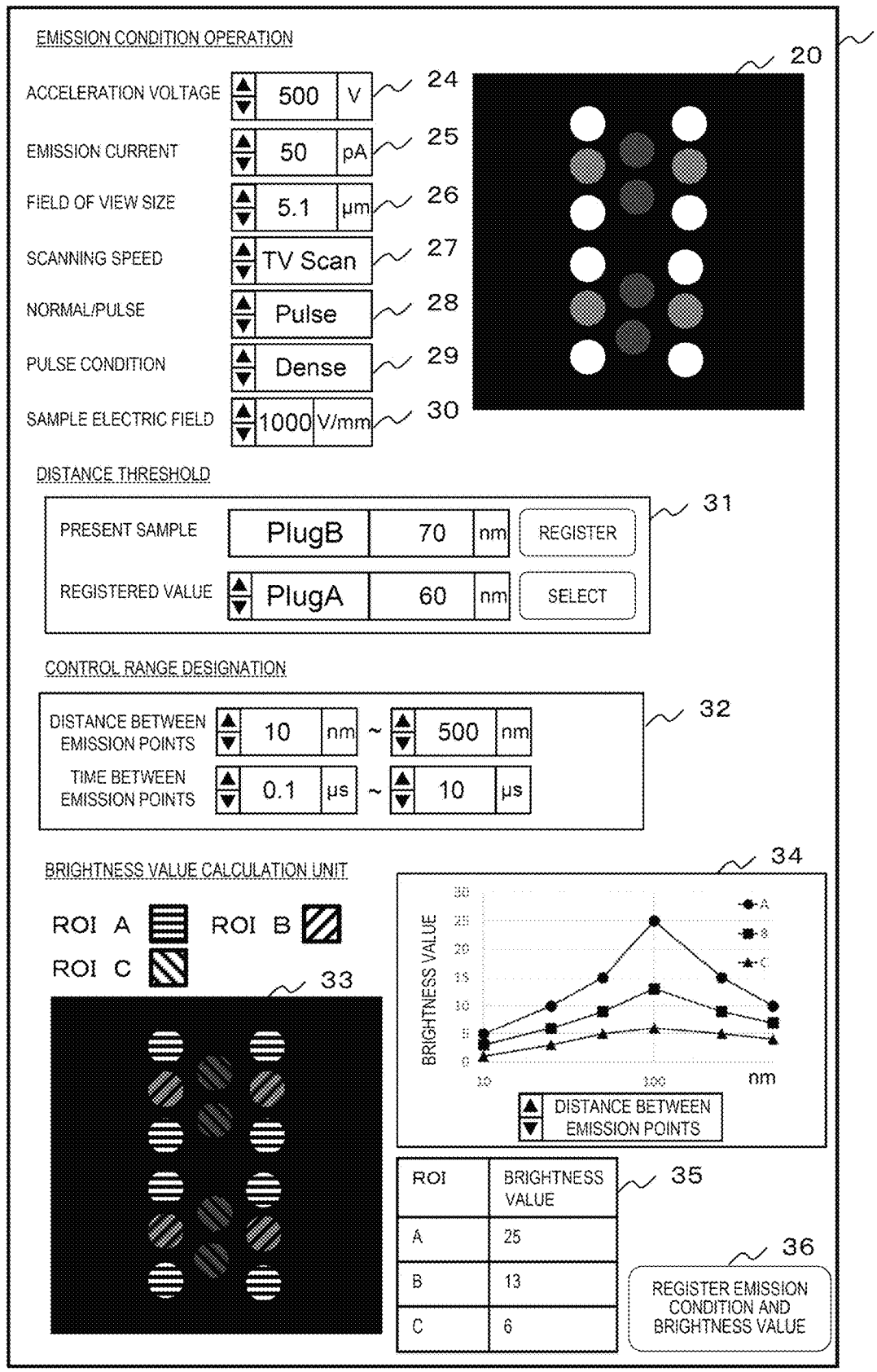

[FIG. 4]
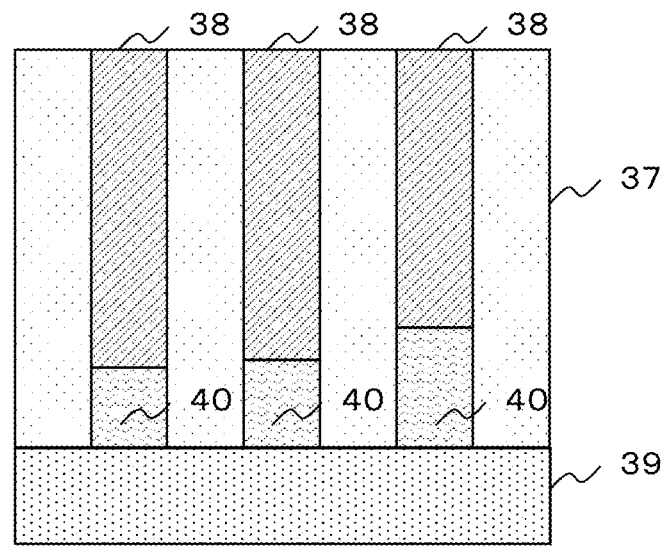
[FIG. 5]
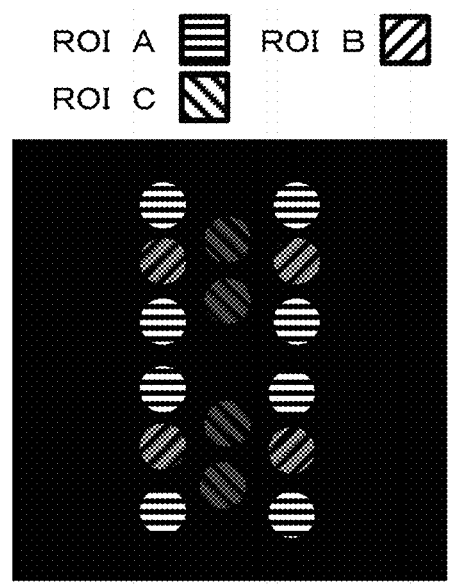

[FIG. 6]
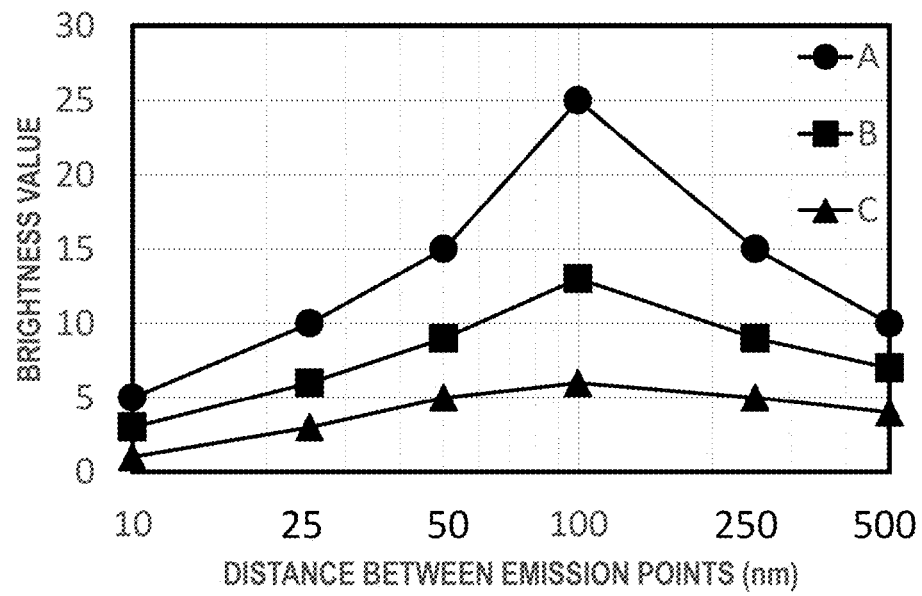
[FIG. 7]
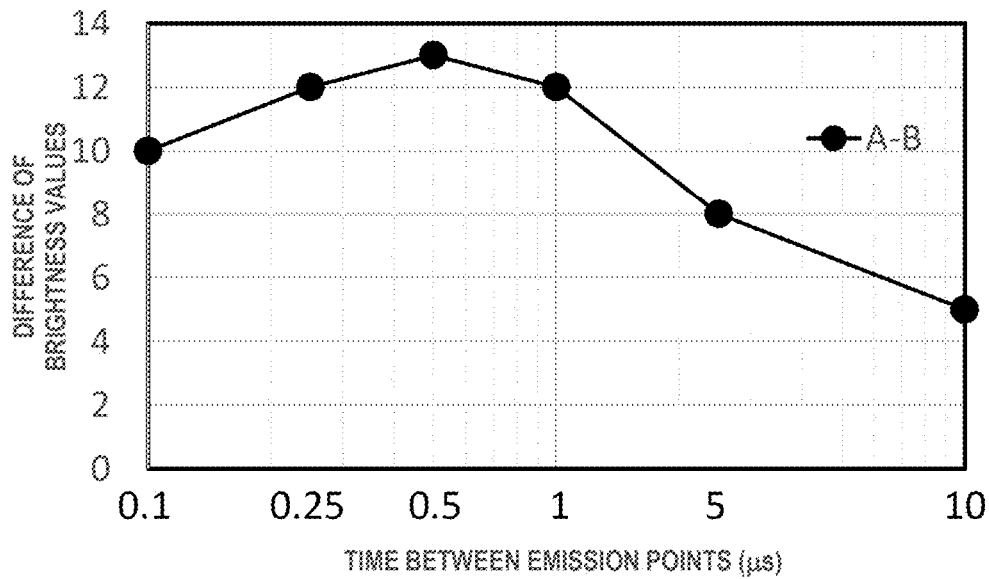

[FIG. 8]
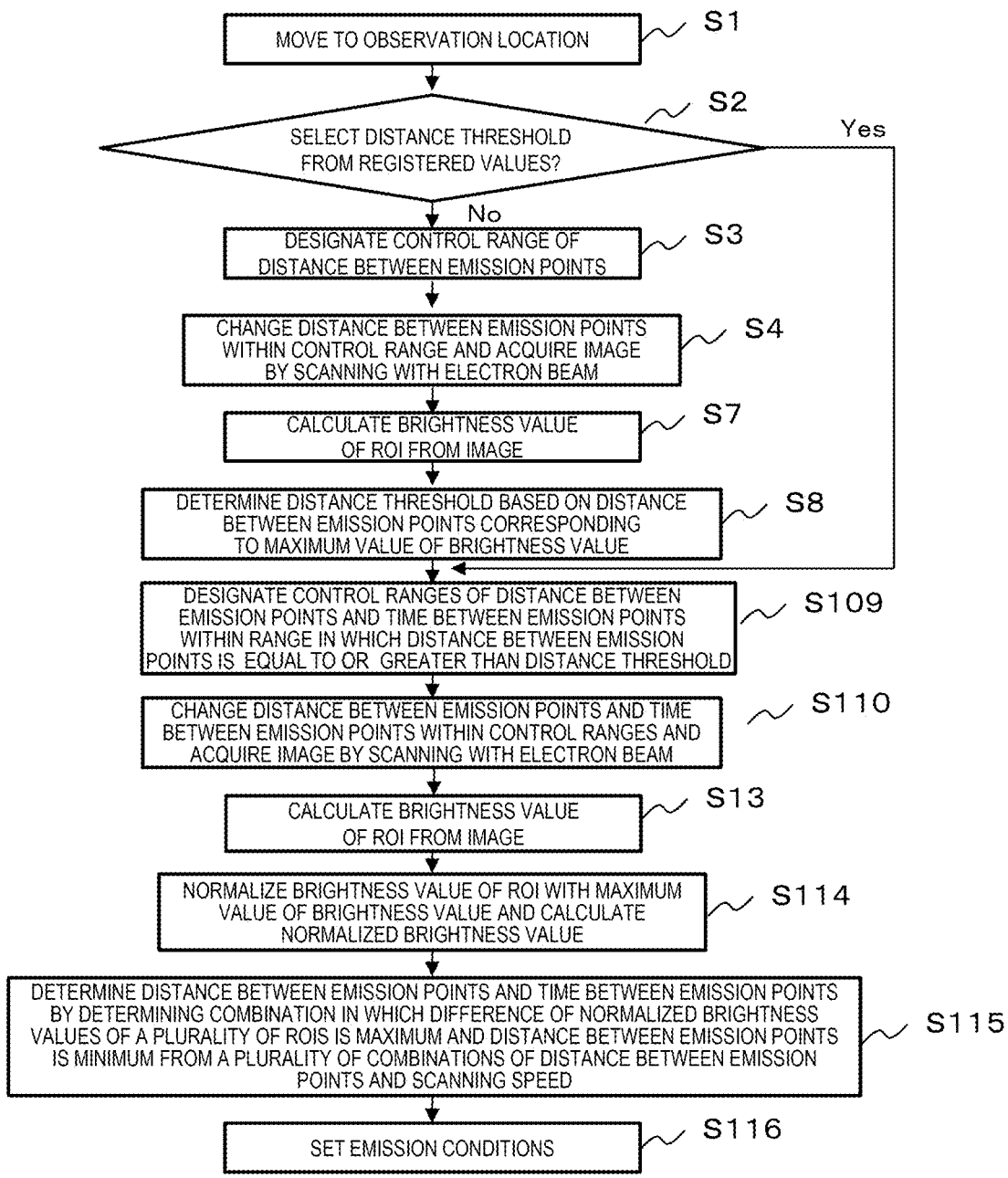

[FIG. 9]
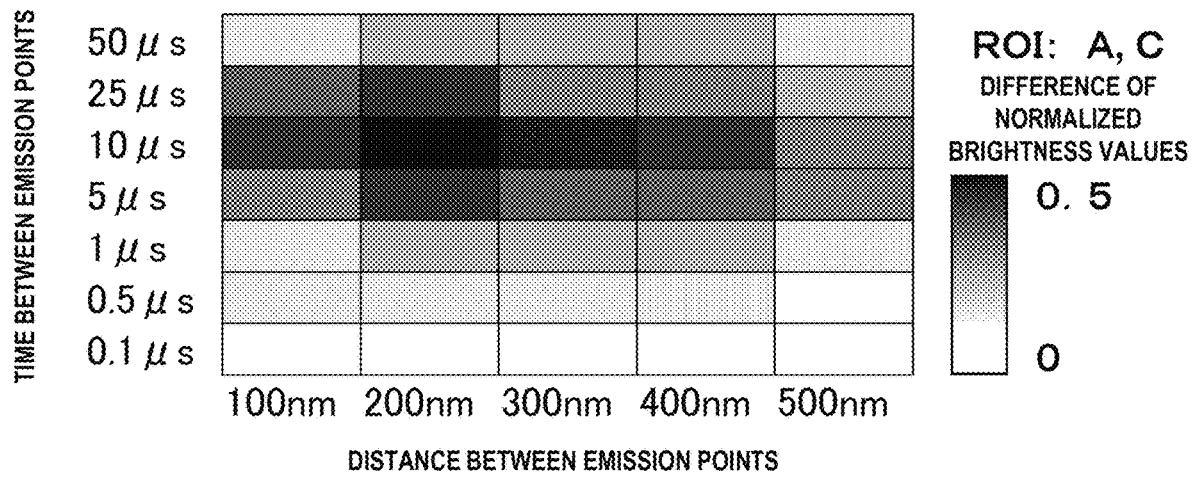

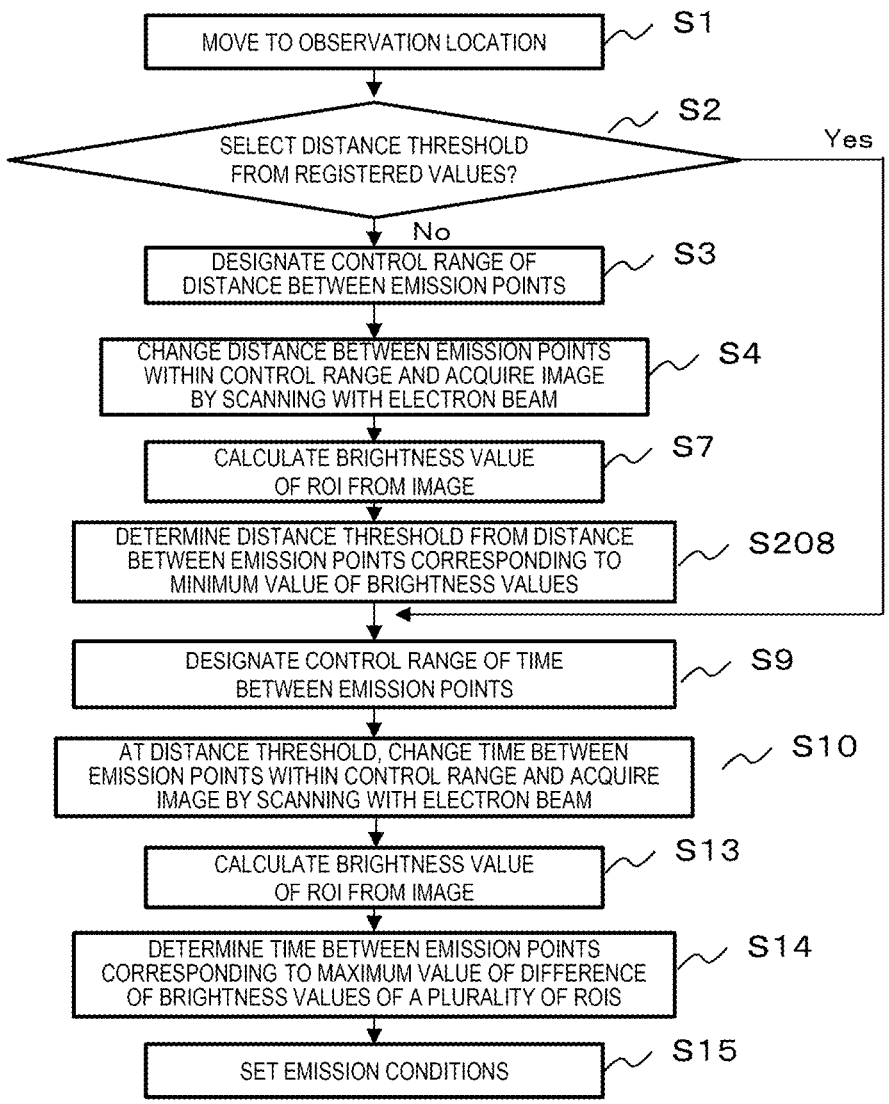
[FIG. 10]

[FIG. 11]
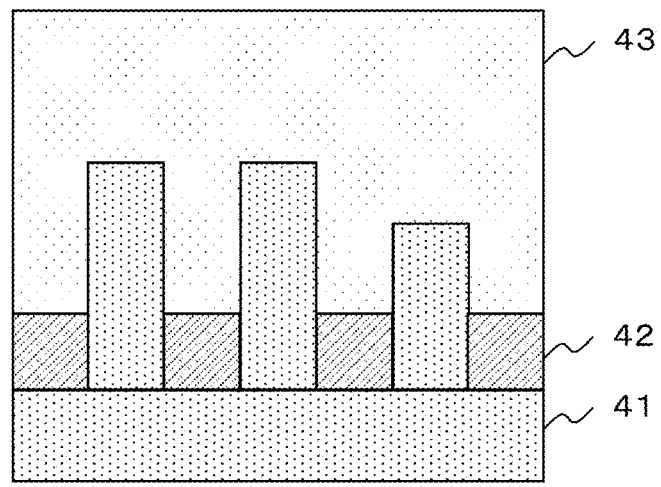
[FIG. 12]
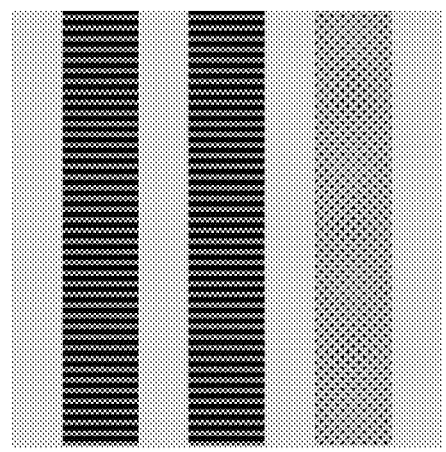

[FIG. 13]
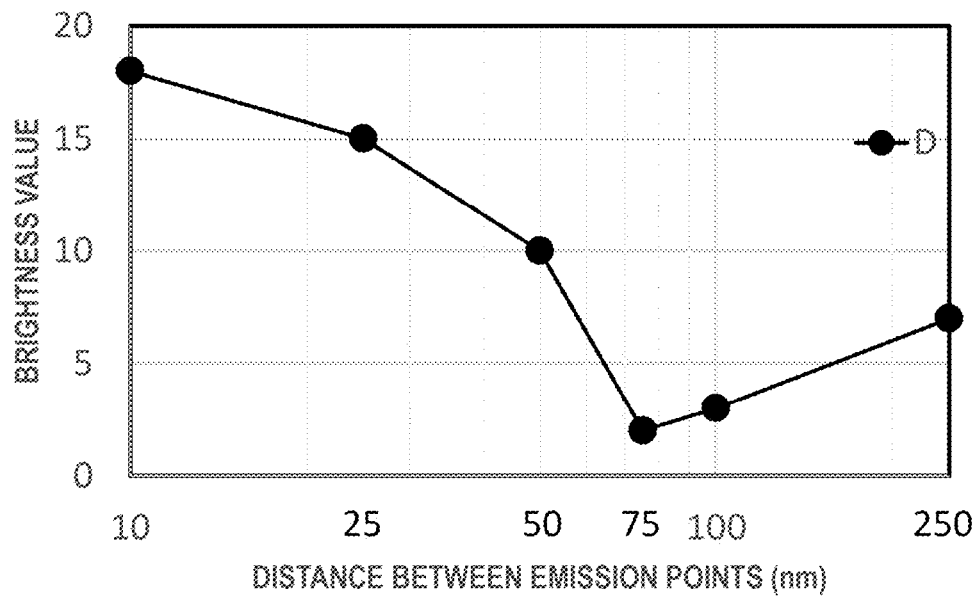
[FIG. 14]
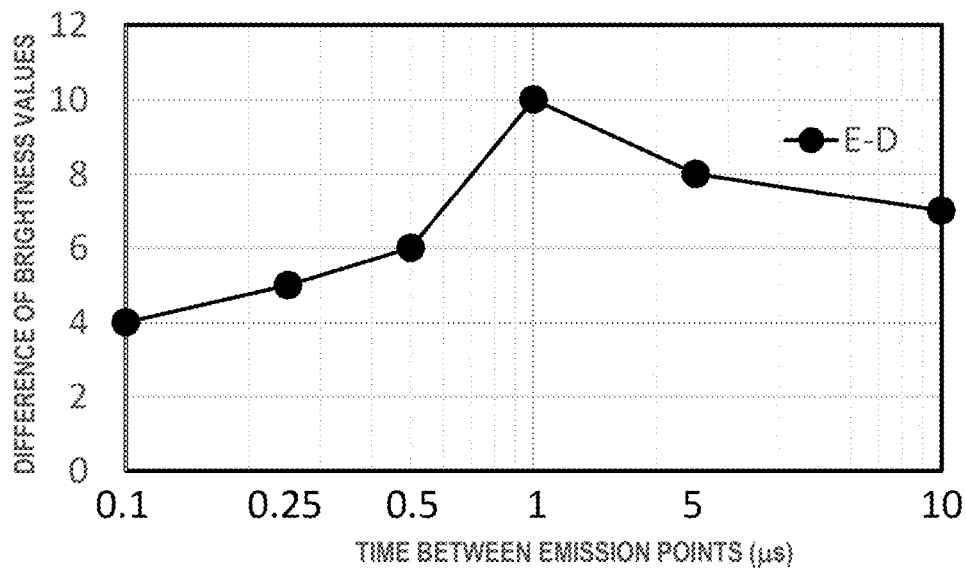

[FIG. 15]
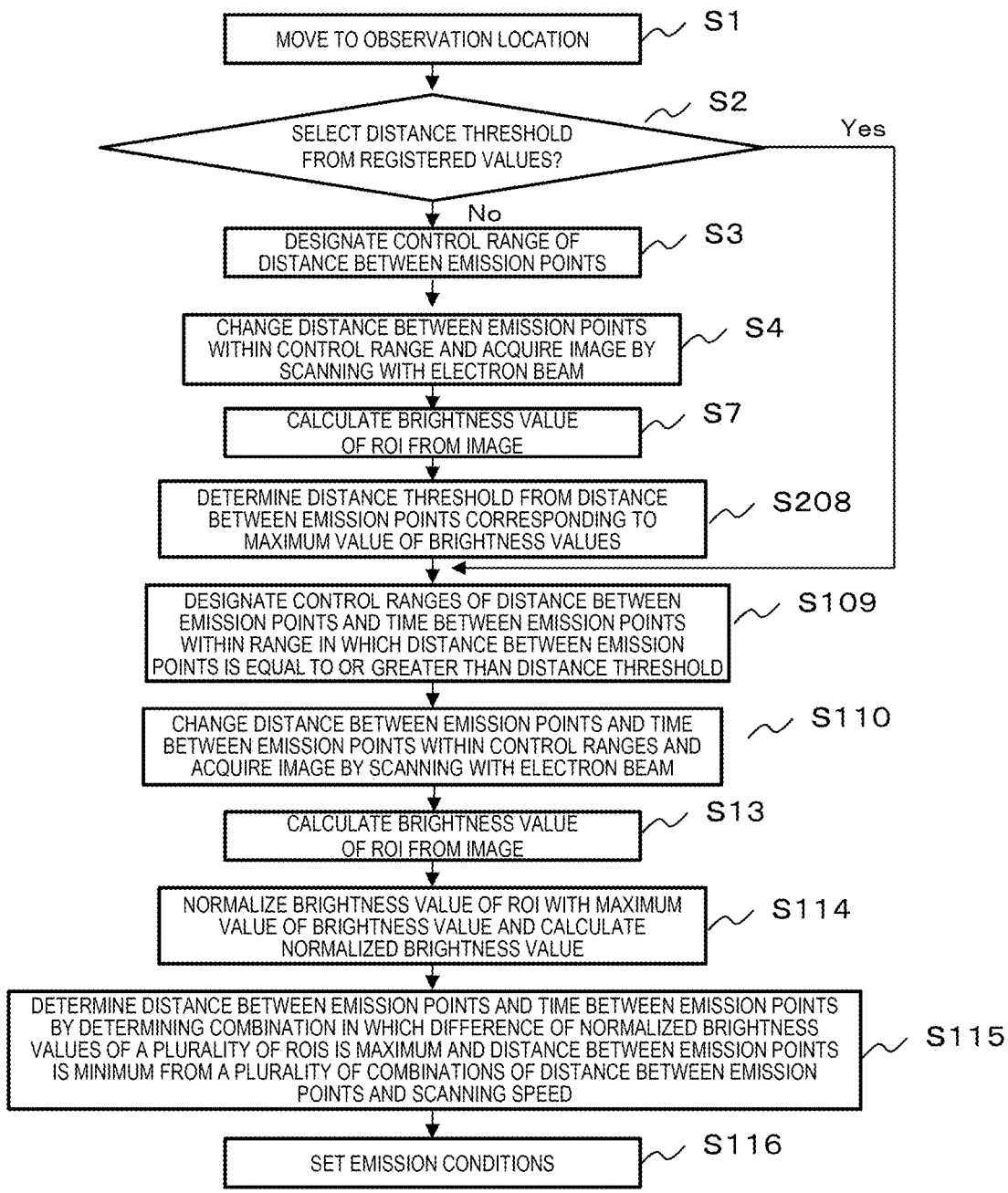

[FIG. 16]
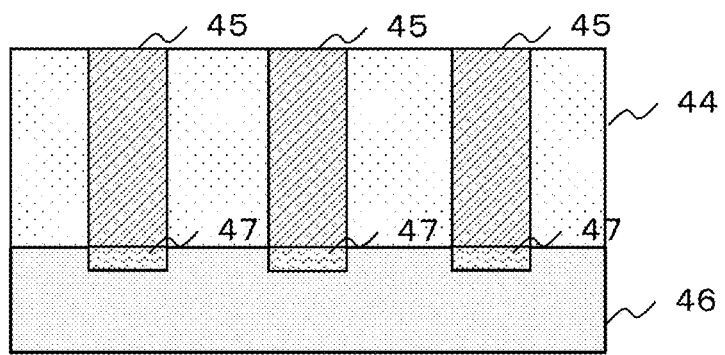
[FIG. 17]
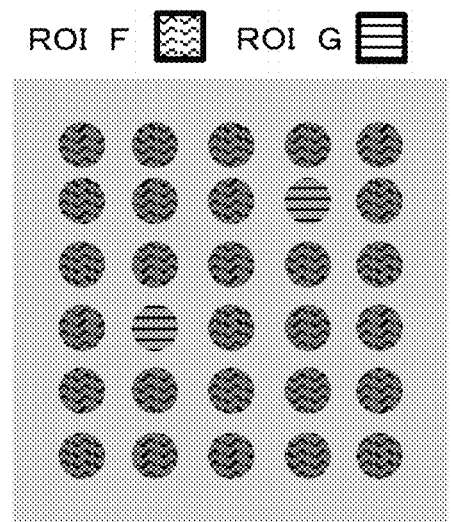

[FIG. 18]
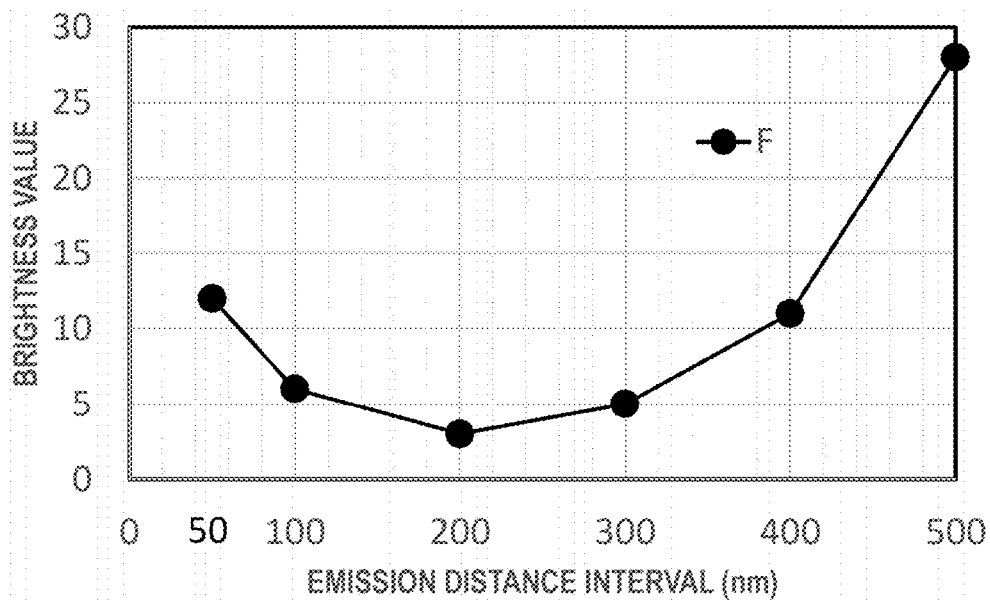
[FIG. 19]
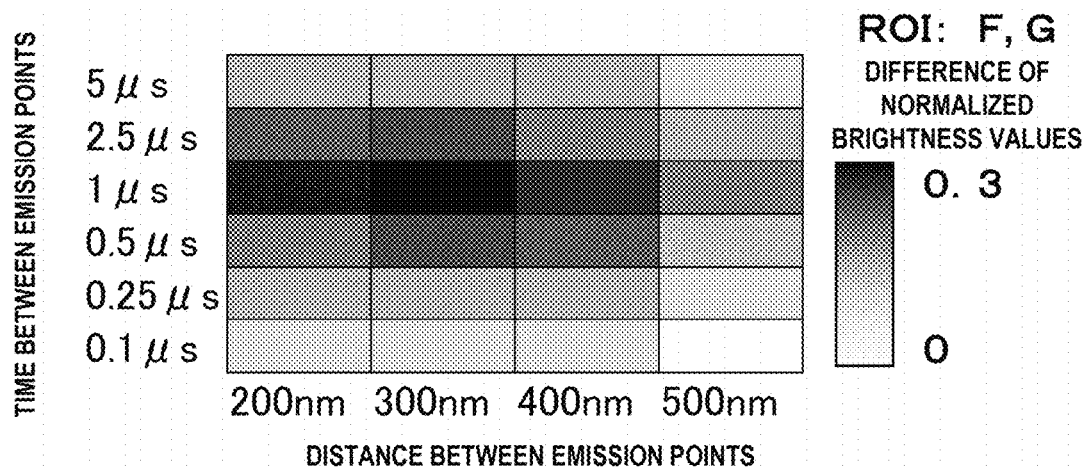

[FIG. 20]
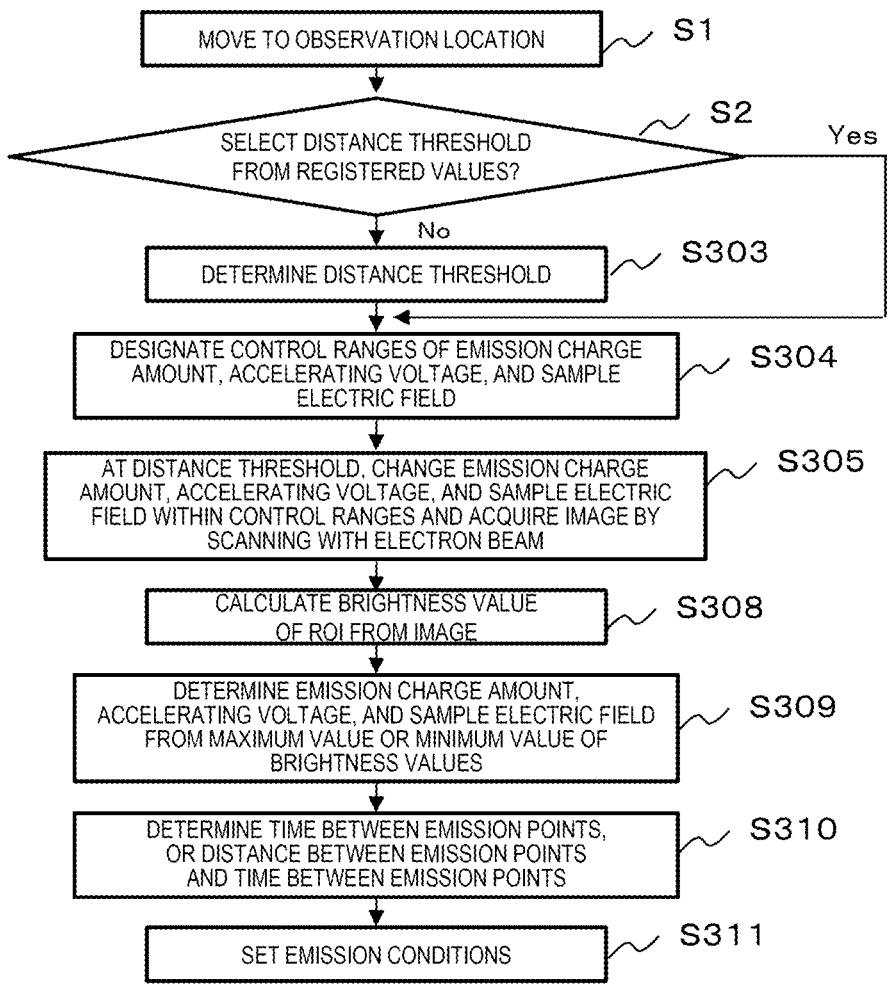

[FIG. 21]
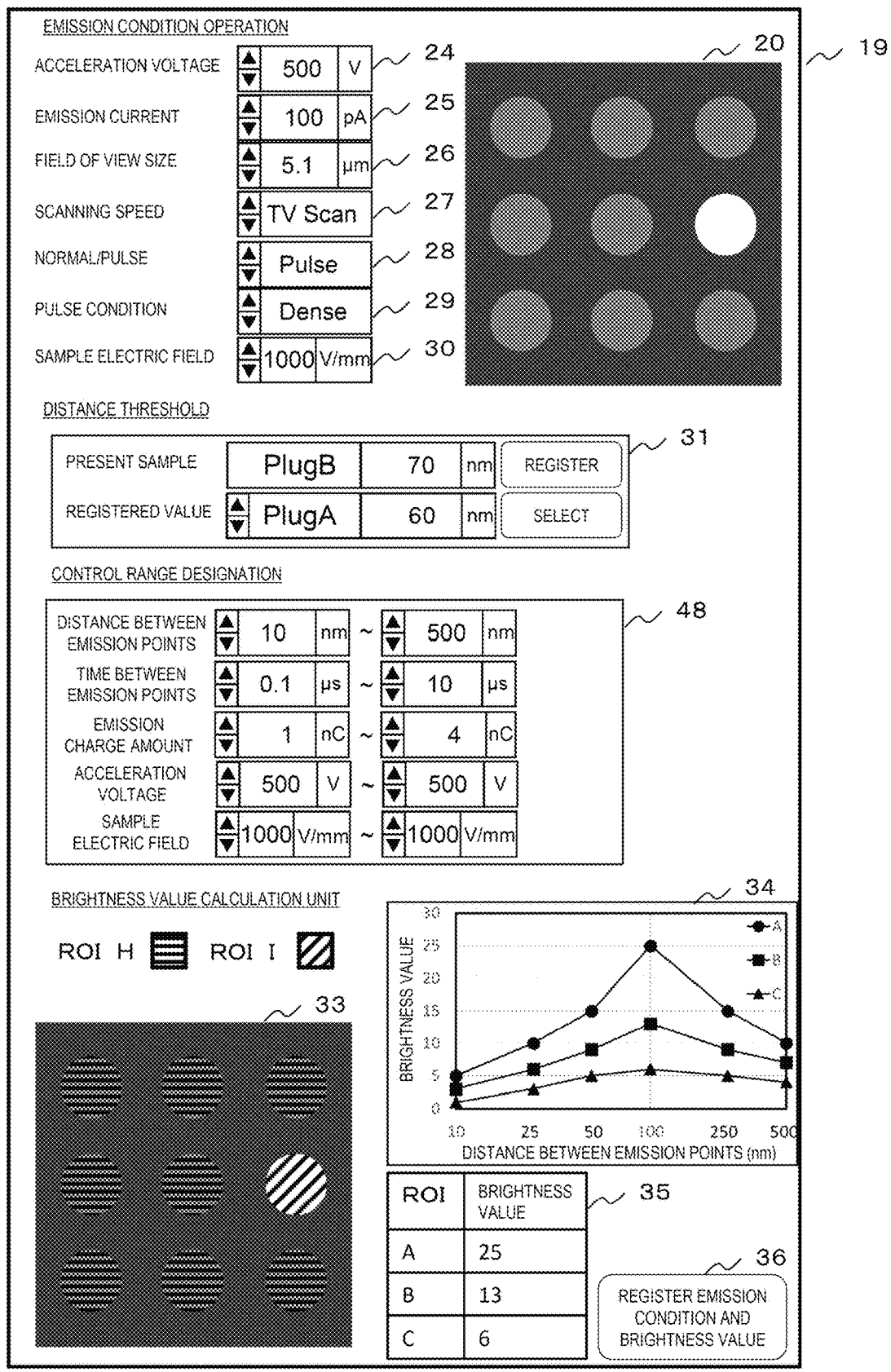

[FIG. 22]
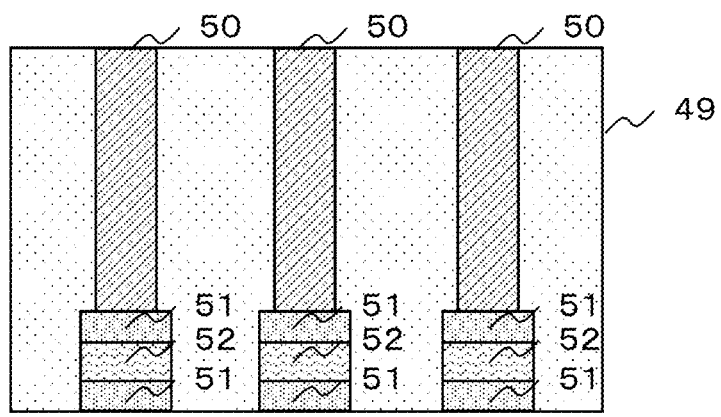
[FIG. 23]
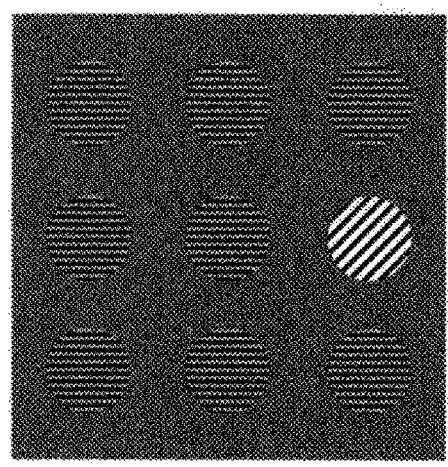

[FIG. 24]
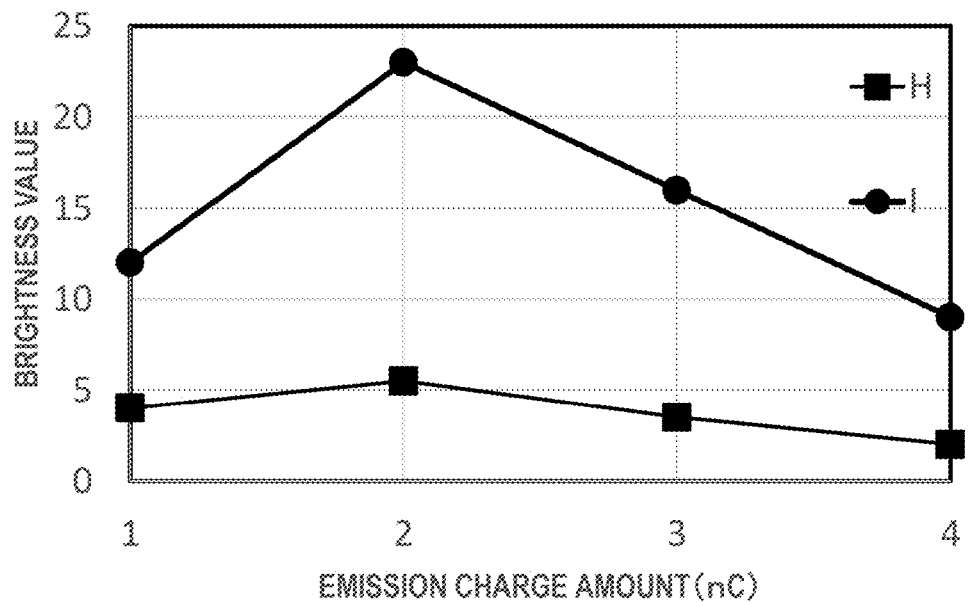
[FIG. 25]
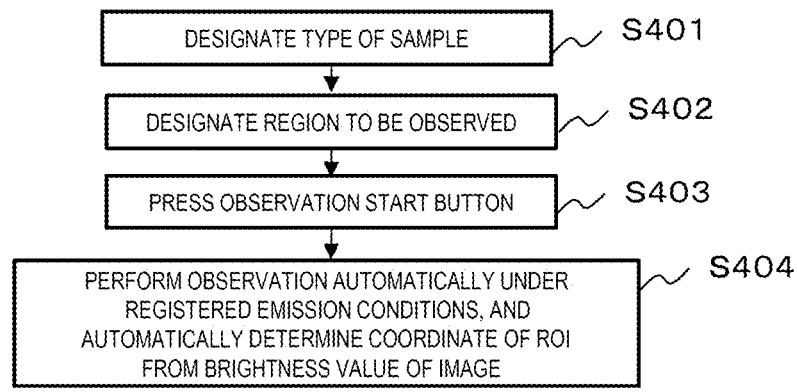

[FIG. 26]

TYPE OF SAMPLE ~ 54
▲▼ PlugB

REGION TO BE OBSERVED DESIGNATION
(1500, 1000) μm ~ (20000,7000) nm ~ 55

OBSERVATION STARTS ~ 56

~ 53

COORDINATE OF ROI (PAGE 1/1224) ~ 57

| ROI A | ROI B | ROI C |
|---|---|---|
| (1506.7, 1004.2)μm | (1508.0, 1040.8)μm | (1504.3, 1003.5)μm |
| (1518.3, 1005.2)μm | (1528.7, 1080.8)μm | (1532.9, 1031.9)μm |
| (1518.3, 1007.3)μm | (1530.4, 1090.7)μm | (1548.2, 1041.7)μm |
| (1518.3, 1009.0)μm | (1530.5, 1091.1)μm | (1578.6, 1012.2)μm |
| (1502.8 1021.8)μm | (1532.4, 1101.1)μm | (1601, 1003.9)μm |

ROI A ▦   ROI B ▨
ROI C ▨

METHOD FOR DETERMINING IRRADIATION CONDITIONS FOR CHARGED PARTICLE BEAM DEVICE AND CHARGED PARTICLE BEAM DEVICE

TECHNICAL FIELD

The present disclosure relates to a charged particle beam device that emits a charged particle beam onto a sample, and particularly relates to a charged particle beam device that pulses and emits the charged particle beam.

BACKGROUND ART

PTL 1 discloses a device that controls a scanning speed and an emission interval of an electron beam, reduces a voltage contrast by controlling an amount of charge emitted onto the sample, and maximizes the contrast of a region to be observed on the sample. Further, PTLs 2 and 3 disclose an electron microscope capable of emitting a pulsed electron beam and adjusting a pulse width of the pulsed beam and an interval time between pulses.

CITATION LIST

Patent Literature

PTL 1: Japanese Patent No. 6239633 (corresponding to U.S. Pat. No. 9,697,987)
PTL 2: Japanese Patent No. 5744629 (corresponding to U.S. Pat. No. 8,907,279)
PTL 3: JP-A-2016-100153 (corresponding to U.S. Pat. No. 9,659,744)

SUMMARY OF INVENTION

Technical Problem

By scanning with a pulsed beam, minute electrical characteristics of a region to be scanned can be revealed as the voltage contrast. However, compared with a normal scanning electron microscope, in order to pulse an emission beam, it is necessary to appropriately set a distance between emission points and time between emission points, and thus the number of parameters to be set increases. When various combinations of the parameters are tried, appropriate device conditions can be set, but it takes a considerable amount of time to reach an optimum device condition. According to the disclosures of PTLs 1 to 3, it is possible to set the distance between emission points and the time between emission points, but there is no disclosure about a method of early finding an appropriate combination of the parameters.

Hereafter, a charged particle beam device for a purpose of easily finding device parameters including at least one of the distance between emission points and the time between emission points will be described.

Solution to Problem

As one aspect for implementing the object described above, an beam emission condition determination method for charged particle beam device when beam scanning is performed while abeam is emitted in a pulse manner includes: changing a distance between emission points of the pulsed beam; acquiring a plurality of images having different distances between emission points; evaluating a feature amount of specific regions of the plurality of images having different distances between emission points; specifying a distance between emission points of the beam at which the feature amount is in a predetermined state; setting the specified distance between emission points, or setting a plurality of distances between emission points based on the specified distance between emission points; evaluating, in a state where the specified distance between emission points or the plurality of distances between emission points are set, a plurality of specific regions included in the plurality of images obtained when time between emission points of the pulsed beam is changed; and specifying a time between emission points at which a feature amount of the plurality of specific regions is in a predetermined state.

Further, as another aspect for implementing the object described above, a charged particle beam device includes: a beam column including a scanning deflector that causes a beam to scan a sample and configured to emit the beam that scans the sample with the scanning deflector onto the sample in a pulse manner; a detector configured to detect a particle obtained by emitting the beam onto the sample; and a controlling system configured to control the beam column. The controlling system is configured to acquire a feature amount of one or more images by processing an output of the detector and instruct to specify a distance between emission points of the pulsed beam at which the feature amount of one or more specific regions of the image obtained based on the output of the detector is in a predetermined state, change, in a state where the specified distance between emission points is set or a plurality of distances between emission points determined based on the specified distance between emission points are set, time between emission points of the pulsed beam, and emit the beam at a time between emission points at which the feature amount of the plurality of specific regions of the image obtained based on the output of the detector is in the predetermined state.

Advantageous Effect

According to the configuration described above, device parameters including at least one of the distance between emission points and the time between emission points can be easily found.

BRIEF DESCRIPTION OF DRAWINGS

FIG. 1 is a diagram showing an example of a scanning electron microscope.
FIG. 2 is a flowchart showing processing of determining a beam emission condition.
FIG. 3 is a diagram showing an example of a GUI screen for inputting the beam emission condition.
FIG. 4 is a diagram showing a cross-sectional structure of a sample according to a first embodiment.
FIG. 5 is a diagram showing an example of a scanning electron microscope image.
FIG. 6 is a graph showing a relationship between a distance between emission points of a pulsed beam and a brightness value of a ROI.
FIG. 7 is a graph showing a relationship between time between emission points of the pulsed beam and a brightness difference between a plurality of ROIs.
FIG. 8 is a flowchart showing processing of determining a beam emission condition.
FIG. 9 is a diagram showing how a brightness difference between ROIs changes according to a combination of a distance between emission points and time between emission points of a pulsed beam.

FIG. 10 is a flowchart showing processing of determining a beam emission condition.

FIG. 11 is a diagram showing a cross-sectional structure of a sample according to a third embodiment.

FIG. 12 is a diagram showing an example of a scanning electron microscope image.

FIG. 13 is a graph showing a relationship between a distance between emission points of a pulsed beam and a brightness value of a ROI.

FIG. 14 is a graph showing a relationship between time between emission points of the pulsed beam and a brightness difference between a plurality of ROIs.

FIG. 15 is a flowchart showing processing of determining a beam emission condition.

FIG. 16 is a diagram showing a cross-sectional structure of a sample according to a fourth embodiment.

FIG. 17 is a diagram showing an example of a scanning electron microscope image.

FIG. 18 is a graph showing a relationship between a distance between emission points of a pulsed beam and a brightness value of a ROI.

FIG. 19 is a diagram showing how a brightness difference between ROIs changes according to a combination of the distance between emission points and time between emission points of the pulsed beam.

FIG. 20 is a flowchart showing processing of determining a beam emission condition.

FIG. 21 is a diagram showing an example of a GUI screen for inputting the beam emission condition.

FIG. 22 is a diagram showing a cross-sectional structure of a sample according to a fifth embodiment.

FIG. 23 is a diagram showing an example of a scanning electron microscope image.

FIG. 24 is a graph showing a relationship between an emission charge amount of a beam and a brightness value.

FIG. 25 is a flowchart showing processing of automatically determining an ROI to be observed.

FIG. 26 is a diagram showing an example of a GUI screen for inputting a type of a sample and a coordinate of the ROI to be observed.

DESCRIPTION OF EMBODIMENTS

Hereafter, a charged particle beam device that forms an enlarged image of a sample based on a signal obtained by emitting a charged particle beam will be described. Among charged particle beam devices, a scanning electron microscope that scans a sample with an electron beam is a device that can obtain a high resolution image. The scanning electron microscope is a device that, by applying an electromagnetic field, focuses the electron beam emitted from an electron source on the sample and scans the sample with the electron beam, and detects, by a detector, electrons emitted from the sample when the electron beam is emitted and forms an image. Since the number of the detected electrons reflects information on the sample, the image having contrast can be formed by scanning with the electron beam.

The contrast of the image is roughly classified into a shape contrast reflecting shape information of the sample, a material contrast reflecting composition information, and a voltage contrast reflecting information of surface voltage. The scanning electron microscope can obtain information for analyzing the shape contrast and the material contrast.

On one hand, when a sample containing an insulator is observed using the scanning electron microscope, a so-called image defect such as a loss of the shape contrast may occur due to charge accumulation in the sample. This is because the voltage contrast is superimposed on the shape contrast, and by reducing the voltage contrast, an image relatively strongly reflecting the shape contrast can be acquired.

On the other hand, when a voltage contrast image can be generated for a region to be observed on the sample (region of interest: ROI), an internal structure of the sample can be observed. For example, when a sample having a stacked structure made of a plurality of materials is observed, since an accumulation amount of charge depends on electrical characteristics such as capacitance and a resistance value of a structure provided in the ROI, the internal structure can be observed by observing the voltage contrast.

However, when a semiconductor device is finer and has a complicated structure, the capacitance of the structure provided in the ROI is small, and as a result, the accumulation amount of charge is small. Accordingly, it is difficult to form an appropriate voltage contrast image.

Hereafter, in order to reveal the minute electrical characteristics of the ROI, an observation method using a device that pulses an electron beam and a device that implements the observation will be described. In the device and the method, the electron beam is pulsed, and a time interval between emission points (time between emission points) or a distance between emission points is controlled in addition to an emission charge amount.

By scanning with the electron beam while repeating emission and non-emission of the electron beam, the voltage contrast is strongly reflected in an image, and the electrical characteristics in the ROI which is difficult to be observed simply by continuously emitting the electron beam can be observed. At this time, the contrast reflects a charge characteristic reflecting a characteristic when the accumulation amount of charge in each portion in the ROI increases, and a discharge characteristic reflecting a characteristic when the accumulation amount of charge decreases.

When the voltage contrast in the ROI is observed using a method of pulsing the electron beam, a contrast in which the charge characteristic and the discharge characteristic are mixed is observed, and a magnitude of each characteristic reflected in the contrast varies depending on emission conditions of the pulsed electron beam. Which of the charge characteristic and the discharge characteristic among the electrical characteristics of a portion provided in the ROI is more likely to be reflected in the contrast varies greatly depending on a type of the ROI. Since it is an important requirement to select either of the charge characteristic and the discharge characteristic, it is desirable to appropriately set the emission conditions of the electron beam, and to independently set a condition for easily reflecting the charge characteristic and a condition for easily reflecting the discharge characteristic.

In embodiments to be described below, a method and a device capable of setting a beam emission condition suitable for generating a voltage contrast image in a short time will be described. Further, as a more specific example, a method for setting electron beam emission conditions of independently setting the condition for easily reflecting the charge characteristic and the condition for easily reflecting the discharge characteristic will be described.

The distance between emission points and the time between emission points of the electron beam are main emission conditions for determining magnitude of the voltage contrast with the pulsed electron beam. The charge characteristic is strongly reflected in the contrast at a distance between emission points at which the voltage contrast is maximum (hereinafter referred to as a "distance threshold"), and the discharge characteristic is strongly reflected in the contrast at a distance interval longer than the distance threshold.

A reason for this is that an effect of the distance between emission points is strongly reflected in the contrast at the distance threshold, whereas a change in an emission time interval is strongly reflected in the contrast at a distance larger than the distance threshold. Therefore, by determining the distance threshold and maintaining the distance between emission points at the distance threshold while controlling the time between emission points, the emission condition for easily reflecting the charge characteristic can be set. Further, by determining the distance threshold and controlling the time between emission points at a distance between emission points larger than the distance threshold, the condition for easily reflecting the discharge characteristic can be set.

Therefore, the emission conditions suitable for observing the electrical characteristics of the ROI can be determined by evaluating and setting the distance between emission points and the time between emission points in an appropriate procedure. Further, time required for determining the emission conditions can be shortened.

The embodiments to be described below will describe, for example, a charged particle beam device including a unit that converges a charged particle beam emitted from a charged particle source, a unit that intermittently pulses the charged particle beam, a unit that controls emission positions of the charged particle beam, a unit that controls the distance between emission points which is a distance between the emission positions of the charged particle beam, a unit that controls the time between emission points which is a time interval between emissions under the distance between emission points, a unit that detects charged particles obtained by emitting the charged particle beam onto the sample, a unit that forms an image based on an output signal of the detection unit and emission position information, a unit that displays the image, a unit that determines a brightness value of a region selected in the image (ROI), a unit that determines, based on a relationship between the brightness value and the distance between emission points, the distance threshold which is the distance between emission points at which the brightness value is maximum, and a unit that determines the time between emission points at the distance threshold based on the brightness value.

Since the time between emission points is determined after selecting a specific distance between emission points, an image in which the electrical characteristics of the sample are reflected with high accuracy can be obtained.

As described above, by determining the distance threshold and determining an emission distance interval and the emission time interval at the distance threshold or at a distance larger than the distance threshold, optimal emission conditions for observing the electrical characteristics of the ROI are determined, and therefore a scanning electron microscope that takes a short time to determine the emission conditions can be provided.

Hereafter, a method for setting the time between emission points and the distance between emission points of the pulsed beam, and a charged particle beam device that performs the setting will be described with reference to the drawings. In the following description, a scanning electron microscope will be described as an example of the charged particle beam device, but the invention is not limited thereto, and is also applicable to an ion beam device or the like that generates an image by scanning a sample with an ion beam.

First Embodiment

The present embodiment will describe a scanning electron microscope that observes the voltage contrast derived from the charge characteristic of the sample with a high accuracy by determining the distance threshold which is the distance between emission points at which the brightness value of the image is maximum and determining a plurality of times between emission points at which a difference of brightness values of a plurality of regions (ROIs) is maximum while maintaining the state.

FIG. 1 shows an example of a device configuration of the scanning electron microscope in the present embodiment. The scanning electron microscope includes an electron optical system (beam column), a stage mechanism system, a control system, an image processing system, an operation and display system, and a registration system. The electron optical system is configured with an electron source 1, a deflector 2, an objective lens 3, a detector 4, an emission and non-emission switching unit 5, and a diaphragm 6. The stage mechanism system includes an XYZ stage 7, a sample holder 8, and a sample 9. The deflector 2 is provided for one-dimensionally or two-dimensionally scanning the sample with an electron beam, and is a control target as to be described later.

The control system includes an electron source control unit 10, a deflection signal control unit 11, an objective lens control unit 12, a detector control unit 13, an XYZ stage control unit 14, a sample electric field control unit 15, and an emission and non-emission control unit 16. The image processing system includes a detection signal processing unit 17 and an image forming unit 18. The control system (control device) may include one or more processors and data storages and control a control target according to an instruction of an operation program (code) that operates the scanning electron microscope and is stored in the data storage. Further, the control device controls each control target so as to automatically perform a device condition setting processing to be described later based on input information input from a graphical user interface (GUI). The image processing system includes one or more processors, performs evaluation of the brightness value of the designated ROI or calculation of the brightness difference between the plurality of ROIs, and transmits obtained information to the control device. The control device controls the control target based on the transmitted information. The brightness value is a value corresponding to a quantity of electrons emitted from a portion corresponding to a pixel of the image, and the more the electrons are emitted from the sample, the higher the brightness is. Further, the present embodiment describes a method of adjusting the beam emission condition based on specification of the brightness value, but a parameter such as a signal amount may be used instead of the brightness value.

The operation and display system includes an emission condition operation unit 19 and an image display unit 20. The registration system includes an emission condition registration unit 21, a distance threshold registration unit 22, and a brightness value registration unit 23. When the emission and non-emission switching unit 5 selects emission, the electron beam emitted from the electron source 1 is focused by the objective lens 3 and emitted onto the sample 9. An emission position on the sample 9 is controlled by the deflector 2. Secondary electrons which are emitted from the sample are guided and detected by the detector 4 via an electric field and a magnetic field on the sample.

The control system as described above is a computer system that controls a scanning deflector and a blanking deflector based on information of a feature amount of the ROI obtained by the image processing system, and constructs a controlling system together with the image processing system.

On the other hand, when the emission and non-emission switching unit 5 selects non-emission, a trajectory of electrons is bent (being deflected off an axis of the beam) by the emission and non-emission switching unit 5 (also referred to as the blanking deflector or a pulsed beam generation deflector), so that the electrons are blocked by the diaphragm 6 and are not emitted onto the sample 9. By switching between the emission and the non-emission in this way, the pulsed electron beam can be emitted onto the sample.

The emission condition of the pulsed electron beam is set by the operation and display system and reflected in the electron optical system and the stage mechanism system via the control system. The determined emission condition is registered in the registration system and can be read by the operation and display system.

In the present embodiment, FIG. 2 shows a flow of determining the emission condition for observing the voltage contrast derived from the charge characteristic of the sample with a high accuracy. The emission condition includes a scanning speed and a deflection timing of a blanking electrode which are control parameters of the distance between emission points and the time between emission points.

First, the sample 9 is moved to an observation location so that the ROI that is a target falls within a field of view (S1). When the ROI has a registered distance threshold, the distance threshold is selected from the distance threshold registration unit 22, and the flow proceeds to S9. When the ROI does not have the registered distance threshold, a control range of the distance between emission points is designated (S3). Next, the distance between emission points is changed within the control range and an image is acquired by scanning with the electron beam (S4).

Next, the brightness value of the ROI is calculated from the image (S7), and the distance threshold is determined based on a distance between emission points corresponding to a maximum value of the brightness value (S8). The present embodiment will describe an example in which one ROI (specific region) is designated and the distance between emission points is specified so that the brightness value (feature amount) of the ROI is maximum. However, the invention is not limited thereto, for example, a plurality of ROIs may be designated and the distance between emission points at which the brightness difference (feature amount) between the ROIs is maximum may be specified. Further, a plurality of ROIs may be designated, and an average value of the brightness of the plurality of ROIs may be used as the feature amount.

Further, when it is possible to determine that sufficient brightness or contrast can be obtained even if the brightness value and the brightness difference are not the maximum, the distance between emission points at this time may be specified. For example, a threshold for evaluating the brightness value may be set in advance and the distance between emission points at which a brightness value equal to or greater than the threshold is obtained may be selected. In this step, a distance between emission points at which the feature amount is in a predetermined state (maximum, equal to or greater than the predetermined value, and the like) is specified.

Next, in a state where the distance between emission points is set as the distance threshold, a control range for changing the time between emission points is designated (S9). Next, in a state where the distance threshold is maintained, the time between emission points is changed within the control range and an image is acquired by scanning with the electron beam (S10). Next, the brightness value of the ROI is calculated from the image (S13), and time between emission points corresponding to a maximum value of the difference of the brightness values is determined (S14).

In step 14, the time between emission points at which the brightness difference between the plurality of ROIs is maximum is specified. However, the invention is not limited thereto. When it is possible to determine that the sufficient contrast can be obtained even if the brightness difference is not the maximum, the time between emission points at this time may be specified. For example, a threshold for evaluating the brightness difference may be set in advance and the time between emission points at which the brightness difference equal to or greater than the threshold is obtained may be selected. In this step, a distance between emission points at which the feature amount is in a predetermined state (maximum, equal to or greater than the predetermined value, and the like) is specified.

In the emission conditions, the distance between emission points is set to the distance threshold determined in S8, and the time between emission points is set to the time between emission points determined in S14 (S15).

FIG. 3 shows a GUI used in the present embodiment. The emission condition operation unit 19 includes the image display unit 20 that displays an image to be observed. Further, as an operation unit for the emission conditions, the emission condition operation unit 19 includes an acceleration voltage setting unit 24, an emission current setting unit 25, a field of view size setting unit 26, a scanning speed setting unit 27, a normal scan and pulse scan switching unit 28, a pulse condition setting unit 29, and a sample electric field setting unit 30.

The normal scan and pulse scan switching unit 28 can select pulse scan when the emission conditions of the voltage contrast are determined and select normal scan when other emission conditions are determined. The pulse condition setting unit 29 can select pulse scanning conditions separately reflecting the distance between emission points and the time between emission points. In addition, the emission condition operation unit 19 includes a distance threshold display unit 31 that displays the distance threshold determined in S8 and registered values of the distance threshold registration unit 22.

Further, the distance threshold display unit 31 has a function of displaying the distance threshold determined based on the maximum value of the brightness value in S8, a function of registering the distance threshold determined in S8, and a function of selecting the distance threshold from the registered values.

The distance threshold display unit 31 displays a distance between emission points stored in a predetermined storage medium in advance, or the distance between emission points determined by the processing of steps 3 to 8. The controlling system performs beam scanning at the distance between emission points displayed on the display unit or at a plurality of distances between emission points which are longer than the displayed distance between emission points serving as a threshold. Further, the controlling system evaluates the brightness difference between the ROIs when the time between emission points is changed at the distance threshold or the distance between emission points greater than the distance threshold.

Since an appropriate distance between emission points or the distance threshold varies depending on a material constituting a sample surface and the like, the appropriate distance between emission points according to the sample can be set by displaying a type of the sample on the GUI screen and setting the distance between emission points stored in association with the sample as the emission condition. Further, by storing the appropriate distance between emission points found by the processing of steps 3 to 8 in the predetermined storage medium together with the type of the sample and displaying this information on the GUI screen, the appropriate distance between emission points can be set based on selection of the type of the sample.

In addition, the emission condition operation unit 19 includes a control range designation unit 32 that designates the control range of the distance between emission points in S3 and the control range of the emission time interval in S9. Further, the emission condition operation unit 19 includes an ROI selection unit 33 that selects the ROI from the image. Further, the emission condition operation unit 19 includes a charge and discharge characteristic display unit 34 that displays a relationship between the calculated brightness value and the distance between emission points or the distance between emission points in the range designated by the control range designation unit 32. The charge and discharge characteristic display unit 34 has a function of selecting and displaying whether to display the relationship between the brightness value and the distance between emission points or the relationship between the brightness value and the time between emission points.

The charge and discharge characteristic display unit 34 displays a graph in which the brightness value is a vertical axis and the distance between emission points is a horizontal axis, and displays the brightness value of a plurality of distances between emission points for each of the plurality of ROIs. By displaying in this way, the distance between emission points at which the brightness value is maximum for each ROI can be grasped. By changing the time between emission points and evaluating the brightness difference between the ROIs after setting the distance between emission points, an appropriate combination of the distance between emission points and the time between emission points can be specified. For example, even when the distance between emission points at which the brightness value is maximum is different for an ROIA, an ROIB, and an ROIC, the distance between emission points suitable for any of the ROIA, the ROIB, and the ROIC can be grasped by displaying an understandable relationship between the distance between emission points of each ROI and the brightness value.

In addition, the emission condition operation unit 19 includes a brightness value display unit 35 that displays the maximum value of the differences of the brightness value in S14. In addition, the emission condition operation unit 19 includes an emission condition and brightness value registration button 36 that registers the determined emission conditions and the brightness value in the emission condition registration unit 21 and the brightness value registration unit 23.

FIG. 4 is a cross-sectional view of a part of the sample used in the present embodiment. The sample of FIG. 4 has a structure in which cylindrical wirings 38 are embedded between interlayer insulating films 37 of a silicon substrate 39, and insulating films 40 are sandwiched between the wirings 38 and the silicon substrate 39. When a thickness of the insulating film 40 or polarities of impurities contained in the silicon substrate 39 are different in each wiring 38, each wiring 38 shows a different electrical characteristic.

FIG. 5 shows the image of the ROI selection unit 33 observed in the present embodiment. In the present embodiment, three regions A, B, and C in FIG. 5 which are regions where the wiring 38 is exposed from the sample surface were selected as the ROIs, and in particular, the emission condition was determined by focusing on a difference between the brightness values of the ROIA and the ROIB. FIG. 6 shows a result of calculating the relationship between the brightness value of the ROI and the distance between emission points by changing the distance between emission points from 10 nm to 500 nm by the control range designation unit 32, so as to determine the distance threshold in the present embodiment.

The distance threshold was determined to be 100 nm from the distance between emission points corresponding to the maximum value of the brightness value of each ROI. FIG. 7 shows a result of calculating a relationship between the difference between the brightness values of the ROIA and the ROIB and the emission time interval by changing the emission time interval from 0.1 µs to 10 µs by the control range designation unit 32 while maintaining the emission distance interval at the distance threshold of 100 nm, so as to determine the time between emission points in the present embodiment. The time between emission points was determined to be 0.5 µs from the maximum value of the difference of the brightness values of the ROIA and the ROIB.

According to the embodiment described above, the voltage contrast derived from the charge characteristic of the sample with a high accuracy can be observed by determining the distance threshold which is the distance between emission points at which the brightness value of the image is maximum and determining the time between emission points at which the difference of the brightness values of the plurality of regions is maximum while maintaining the distance between emission points which is the distance threshold.

Second Embodiment

The present embodiment will describe a scanning electron microscope for observing a voltage contrast derived from the discharge characteristic of the sample with a high accuracy by determining the distance threshold which is the distance between emission points at which the brightness value of the image is maximum and determining the distance between emission points and the time between emission points at a distance interval equal to or greater than the distance threshold at which the difference of the brightness values of the plurality of regions is maximum. In the present embodiment, the scanning electron microscope described in FIG. 1 is used.

FIG. 8 shows a flow of determining the emission conditions. The basic flow of the present embodiment is similar to that in FIG. 2. A difference between the flow shown in FIG. 8 and the flow shown in FIG. 2 is S109 of specifying the control ranges of the distance between emission points and the time between emission points within a range in which the emission distance interval is equal to or greater than the distance threshold, and S110 of changing the distance between emission points and the time between emission points within the control ranges and acquiring the image by scanning with the electron beam. Further, the brightness value of the ROI is normalized with the maximum value of the brightness value and the normalized brightness value is calculated (S114). Thereafter, the distance between emission points and the time between emission points are determined by determining a combination in which a difference of the normalized brightness values of the plurality of ROIs is maximum and the distance between emission points is minimum from a plurality of combinations of the distance between emission points and the scanning speed (S115). The distance between emission points and the emission time interval of the emission conditions are set to the values determined in S115 (S116).

In the present embodiment, the GUI described in FIG. 3 is used. Further, in the present embodiment, the sample described in FIG. 4 is used, and the three regions A, B, and C in FIG. 5 were selected as the ROIs, and in particular, the emission condition was determined by focusing on a difference between the brightness values of the ROIA and the ROIC. Since the relationship between the brightness value of the ROI and the distance between emission points is the same as that in FIG. 6, the distance threshold was determined to be 100 nm. FIG. 9 shows a result of calculating the relationship between the difference between the normalized brightness values of the ROIA and the ROIC, the distance between emission points, and the time between emission points by changing the distance between emission points within a range from 100 nm to 500 nm in which the distance threshold is equal to or greater than 100 nm and changing the time between emission points from 10 μs to 100 μs by the control range designation unit 32, so as to determine the distance between emission points and the time between emission points in the present embodiment.

In FIG. 9, a horizontal axis is the distance between emission points and a vertical axis is the time between emission points. A color is darker as the difference of the normalized brightness values increases for a combination of the distance between emission points and the time between emission points. The distance between emission points and the time between emission points at which the difference between the normalized brightness values of the ROIs A and C is maximum were respectively determined to be 200 nm and 10 μs.

According to the embodiment described above, the voltage contrast derived from the discharge characteristic of the sample with a high accuracy can be observed by determining the distance threshold which is the distance between emission points at which the brightness value of the image is maximum and determining the emission distance interval and the time between emission points at which the difference of the brightness values of the plurality of regions is maximum while maintaining the distance between emission points which is the distance threshold.

Even in the present embodiment and in the following embodiments, similar to the first embodiment, various forms can be used as the feature amount for specifying the distance between emission points and the time between emission points and a criterion for determining a predetermined state.

Third Embodiment

The present embodiment will describe a scanning electron microscope for observing a voltage contrast derived from the charge characteristic of the sample with a high accuracy by determining the distance threshold which is the distance between emission points at which the brightness value of the image is minimum (or equal to or less than a predetermined threshold) and determining the time between emission points at which the difference of the brightness values of the plurality of regions is maximum in a state where the distance between emission points corresponds to the distance threshold. In the present embodiment, the scanning electron microscope described in FIG. 1 is used.

In the present embodiment, FIG. 10 shows a flow of determining the emission condition for observing the voltage contrast derived from the charge characteristic of the sample with a high accuracy. The basic flow of the present embodiment is similar to that in FIG. 2. In the flow of the present embodiment, the distance threshold is determined from the distance between emission points corresponding to a minimum value of the brightness values (S208). In the present embodiment, the GUI described in FIG. 3 is used.

FIG. 11 shows a cross-sectional view of a sample used in the present embodiment. In the sample of FIG. 11, intergroove insulating films 42 are buried in silicon 41 formed with grooves. Such a structure is covered with a mask 43. When there are regions where heights of protrusions of the silicon 41 are different, the mask 43 shows different electrical characteristics in the regions. FIG. 12 shows an image of the ROI selection unit 33 observed in the present embodiment. In the present embodiment, two regions D and E in FIG. 12, which are regions where the mask 43 covers portions directly above the protrusions of the silicon 41, are selected as the ROIs. FIG. 13 shows a result of calculating a relationship between a brightness value of the ROID and the emission distance interval by changing the distance between emission points from 10 nm to 250 nm by the control range designation unit 32, so as to determine the distance threshold in the present embodiment. The distance threshold was determined to be 75 nm from a distance between emission points corresponding to the minimum value of the brightness values of the ROID.

FIG. 14 shows a result of calculating a relationship between a difference between the brightness values of the ROID and the ROIE and the time between emission points by changing the emission time interval from 0.1 μs to 10 μs by the control range designation unit 32 while maintaining the distance between emission points at the distance threshold of 75 nm, so as to determine the time between emission points in the present embodiment. The time between emission points was determined to be 1 μs from a maximum value of the difference of the brightness values of the ROID and the ROIE.

According to the present embodiment in this way, the voltage contrast derived from the charge characteristic of the sample with a high accuracy can be observed by determining the distance threshold which is the distance between emission points at which the brightness value of the image is minimum, and determining the time between emission points at which the difference of the brightness values of the plurality of regions is maximum while maintaining the distance between emission points corresponding to the distance threshold.

Fourth Embodiment

The present embodiment will describe a scanning electron microscope for observing a voltage contrast derived from the discharge characteristic of the sample with a high accuracy by determining the distance threshold which is the distance between emission points at which the brightness value of the image is minimum and determining the distance between emission points and the time between emission points at a distance interval equal to or greater than the distance threshold at which the difference of the brightness values of the plurality of regions is maximum. In the present embodiment, the scanning electron microscope described in FIG. 1 is used.

In the present embodiment, FIG. 15 shows a flow of determining the emission condition for observing the voltage contrast derived from the discharge characteristic of the sample with a high accuracy. The basic flow of the present embodiment is similar to that in FIG. 8. In the flow of the present embodiment, the distance threshold is determined from the distance between emission points corresponding to the minimum value of the brightness values (S208). In the present embodiment, the GUI described in FIG. 3 is used.

FIG. 16 shows a cross-sectional view of a sample used in the present embodiment. The sample of FIG. 16 has a structure in which contact plugs 45 are buried between interlayer insulating films 44, a silicon substrate 46 is buried in lower portions of the contact plugs 45, and ion implantation layers 47 are formed at junctions between the contact plugs 45 and the silicon substrate 46.

When a concentration of ions injected into an ion implantation layer is different from those of others, the contact plugs 45 show different electrical characteristics. FIG. 17 shows an image of the ROI selection unit 33 observed in the present embodiment. In the present embodiment, two regions F and G in FIG. 17, which are regions where the contact plugs 45 are exposed on the sample surface, are selected as the ROIs.

FIG. 18 shows a result of calculating a relationship between a brightness value of the ROIF and the distance between emission points by changing the distance between emission points from 50 nm to 500 nm by the control range designation unit 32, so as to determine the distance threshold in the present embodiment. The distance threshold was determined to be 200 nm from a distance between emission points corresponding to a minimum value of the brightness values of the ROIF. FIG. 19 shows a result of calculating a relationship between a difference between normalized brightness values of the ROIF and the ROIG, the distance between emission points, and the time between emission points by changing the distance between emission points within a range from 200 nm to 500 nm in which the distance threshold is equal to or greater than 200 nm and changing the time between emission points from 0.1 μs to 5 μs by the control range designation unit 32, so as to determine the emission distance interval and the emission time interval in the present embodiment. In FIG. 19, a horizontal axis is the distance between emission points and a vertical axis is the time between emission points. A color was darker as the difference of the normalized brightness values increases for a combination of the distance between emission points and the time between emission points. The distance between emission points and the time between emission points from a combination of the distance between emission points and the time between emission points at which the difference of the normalized brightness values of the ROIs F and G is maximum were respectively determined to be 300 nm and 1 μs.

According to the present embodiment in this way, the voltage contrast derived from the discharge characteristic of the sample with a high accuracy can be observed by determining the distance threshold which is the distance between emission points at which the brightness value of the image is minimum, and determining the distance between emission points and the time between emission points at a distance interval equal to or greater than the distance threshold at which the difference of the brightness values of the plurality of regions is maximum.

Fifth Embodiment

The present embodiment will describe a scanning electron microscope for observing the voltage contrast of the sample with a high accuracy by determining an emission charge amount, an acceleration voltage, and a sample electric field when emitting a charged particle beam while keeping the distance between emission points at the distance threshold. In the present embodiment, the scanning electron microscope described in FIG. 1 is used.

In the present embodiment, FIG. 20 shows a flow of determining the emission condition for observing the voltage contrast derived from the discharge characteristic of the sample with a high accuracy. The emission condition includes the scanning speed and the distance between emission points, which are control parameters of the distance between emission points and the time between emission points, and includes one or more of the emission charge amount, the acceleration voltage, and the sample electric field. The sample is moved to the observation location so that the ROI falls within the field of view (S1).

Next, it is determined whether the distance threshold is selected from registered values of the distance threshold registration unit 22 (S2). When the ROI does not has a registered distance threshold, the flow proceeds to S303. When the ROI has the registered distance threshold, the distance threshold is selected from the distance threshold registration unit 22, and the flow proceeds to S304. Next, the distance threshold is determined using the flow shown in FIG. 2 or FIG. 8 or FIG. 10 or FIG. 15 (S303).

Next, control ranges of the emission charge amount, the acceleration voltage, and the sample electric field are designated (S304). Next, at the distance threshold, the emission charge amount, the acceleration voltage, and the sample electric field are changed within the control ranges and an image is acquired by scanning with the electron beam (S305). Next, the brightness value of the ROI is calculated from the image (S308).

Next, the emission charge amount, the acceleration voltage, and the sample electric field are determined from the maximum value of the brightness value when the distance threshold is determined using the flow of FIG. 2 or FIG. 8 in S303, or from the minimum value of the brightness value when the distance threshold is determined using the flow of FIG. 10 or FIG. 15 in S303 (S309). Next, the time between emission points, or the distance between emission points and the time between emission points are determined using the flow shown in FIG. 2 or FIG. 8 or FIG. 10 or FIG. 15 (S310).

Next, the emission condition is set in which the emission charge amount, the acceleration voltage, the sample electric field, the distance between emission points, and the time between emission points among the emission conditions are set to the values determined in S115 (S311).

FIG. 21 shows a GUI used in the present embodiment. A basic structure of the GUI is similar to that in FIG. 3. The GUI of the present embodiment includes a control range designation unit 48 that designates the control ranges of the emission charge amount, the acceleration voltage, and the sample electric field in S304 in addition to the control ranges of the distance between emission points and the time between emission points.

FIG. 22 shows a cross-sectional view of a part of a sample used in the present embodiment. The sample of FIG. 22 has a structure in which wirings 50 are buried between interlayer insulating films 49, and an electrode 51, an insulating film 52, and an electrode 51 are sequentially stacked on a lower layer of each of the wirings 50. When the upper and lower electrodes 51 are not insulated via the insulating film 52, the wiring 50 shows a different electrical characteristic from the other wirings 50. FIG. 23 shows an image of the ROI selection unit 33 observed in the present embodiment. In the present embodiment, two regions H and I in FIG. 23, which are regions where the wiring 50 is exposed on the sample surface, are selected as the ROIs. FIG. 24 shows a result of calculating a relationship between the brightness value of the ROI and the emission charge amount by changing the emission charge amount from 1 nC to 4 nC by the control range designation unit 48, so as to determine the emission charge amount in the present embodiment. The emission charge amount was determined to be 2 nC from the emission charge amount corresponding to the maximum value of the brightness value of each ROI. By determining the emission charge amount in this way, the electrical characteristics of the ROI can be more strongly reflected in the voltage contrast.

According to the present embodiment in this way, the voltage contrast of the sample with a high accuracy can be observed by determining the emission charge amount, the acceleration voltage, and the sample electric field when emitting the charged particle beam while keeping the distance between emission points at the distance threshold.

Sixth Embodiment

In the present embodiment, a scanning electron microscope automatically determines a coordinate of a ROI in a region to be observed by measuring a specified region to be observed using registered emission conditions and registered brightness values and automatically determining a coordinate of a brightness value which is the same as a registered brightness value. In the present embodiment, the scanning electron microscope described in FIG. 1 is used.

FIG. 25 shows a flow of automatically determining the coordinate of the ROI in the region to be observed in present embodiment. The type of the sample is designated (S401). By specifying the type of the sample, the emission conditions registered in the emission condition registration unit 21 are set. The region to be observed is designated (S402). An observation start button 56 is pressed (S403). The observation start button 56 will be described later with reference to FIG. 26. The observation is automatically performed under the registered emission conditions, and the coordinate of the ROI is automatically determined from the brightness value of an image (S404).

FIG. 26 shows a GUI used in present embodiment. An image and coordinate display unit 53 includes a sample designation unit that designates the type of the sample. The image and coordinate display unit 53 further includes an observation coordinate setting unit 55 that sets a coordinate to be observed. The image and coordinate display unit 53 further includes the observation start button 56 that starts the automatic observation. In addition, the image and coordinate display unit 53 includes an ROI coordinate display unit 57 that displays the coordinate of the ROI determined in S404.

In the present embodiment, the sample described in FIG. 4 is used, and the three regions A, B, and C shown in FIG. 5 are selected as the ROIs. A part of the automatically determined coordinates of the ROI are shown in the ROI coordinate display unit 57 of FIG. 26.

According to the present embodiment in this way, the coordinate of the ROI in the region to be observed can be automatically determined by measuring the specified region to be observed using the registered emission conditions and the registered brightness values and automatically determining the coordinate of the brightness value which is the same as the registered brightness values.

The electron beam is used for observing the sample in the above-described embodiments, whereas the disclosure is not limited thereto, and a similar observation can be performed with other charged particle beams.

REFERENCE SIGN LIST 1 electron source
2 deflector
3 objective lens
4 detector
5 emission and non-emission switching unit
6 diaphragm
7 XYZ stage
8 sample holder
9 sample
10 electron source control unit
11 deflection signal control unit
12 objective lens coil control unit
13 detector control unit
14 XYZ stage control unit
15 sample electric field control unit
16 emission and non-emission control unit
17 detection signal processing unit
18 image forming unit
19 emission condition operation unit
20 image display unit
21 emission condition registration unit
22 distance threshold registration unit
23 brightness value registration unit
24 acceleration voltage setting unit
25 emission current setting unit
26 field of view size setting unit
27 scanning speed setting unit
28 normal scan and pulse scan switching unit
29 pulse condition setting unit
30 sample electric field setting unit
31 distance threshold display unit
32 control range designation unit
33 ROI selection unit
34 charge and discharge characteristic display unit
35 brightness value display unit
36 emission condition and brightness value registration button
37 interlayer insulating film
38 wiring
39 silicon substrate
40 insulating film
41 silicon
42 inter-groove insulating film
43 mask
44 interlayer insulating film
45 contact plug
46 silicon substrate
47 ion implantation layer
48 control range designation unit
49 interlayer insulating film
50 wiring
51 electrode
52 insulating film
53 image and coordinate display unit
54 sample designation unit
55 observation coordinate setting unit
56 observation start button
57 ROI coordinate display unit

The invention claimed is:
1. A beam emission condition determination method for charged particle beam device when beam scanning is per- formed while a beam is emitted in a pulse manner, the beam emission condition determination method comprising:

changing a distance between emission points of the pulsed beam;

acquiring a plurality of images having different distances between emission points;

evaluating a feature amount of specific regions of the plurality of images having different distances between emission points;

specifying a distance between emission points of the beam at which the feature amount is in a predetermined state;

setting the specified distance between emission points, or setting a plurality of distances between emission points based on the specified distance between emission points;

evaluating, in a state where the specified distance between emission points or the plurality of distances between emission points are set, a plurality of specific regions included in the plurality of images obtained when time between emission points of the pulsed beam is changed; and specifying a time between emission points at which a feature amount of the plurality of specific regions is in a predetermined state.

2. The emission condition determination method for charged particle beam device according to claim 1, wherein when the feature amount of the specific regions of the plurality of images having different distances between emission points are evaluated, a brightness value of the specific region is evaluated.

3. The emission condition determination method for charged particle beam device according to claim 2, wherein a distance between emission points of the beam whose brightness value of the specific region is minimum, maximum, equal to or larger than a predetermined threshold, or equal to or less than a predetermined threshold, is specified.

4. The emission condition determination method for charged particle beam device according to claim 1, wherein when the time between emission points is specified, time between emission points at which a brightness difference of the plurality of specific regions is maximum or equal to or greater than a predetermined threshold is specified.

5. The emission condition determination method for charged particle beam device according to claim 1, wherein in a state where the plurality of distances between emission points are set, a plurality of times between emission points are set, and a combination of a distance between emission points and a time between emission points at which the feature amount of the plurality of specific regions are in the predetermined state is specified.

6. The emission condition determination method for charged particle beam device according to claim 5, wherein a combination of the distance between emission points and the time between emission points at which a brightness difference of the plurality of specific regions is maximum or equal to or greater than the predetermined threshold is specified.

7. A charged particle beam device comprising:

a beam column including a scanning deflector that causes a beam to scan a sample and configured to emit the beam that scans the sample with the scanning deflector onto the sample in a pulse manner;

a detector configured to detect a particle obtained by emitting the beam onto the sample; and a controlling system configured to control the beam column, wherein the controlling system is configured to acquire a feature amount of one or more images by processing an output of the detector, and instruct to specify a distance between emission points of the pulsed beam at which the feature amount of one or more specific regions of the image obtained based on the output of the detector is in a predetermined state, change, in a state where the specified distance between emission points is set or a plurality of distances between emission points determined based on the specified distance between emission points are set, time between emission points of the pulsed beam, and emit the beam at a time between emission points at which the feature amount of the plurality of specific regions of the image obtained based on the output of the detector is in the predetermined state.

8. The charged particle beam device according to claim 7, wherein the beam column includes a pulsed beam generation deflector that deflects the beam off-axis, and the controlling system controls the scanning deflector and the pulsed beam deflector so as to obtain the pulsed beam corresponding to the set distance between emission points and the set time between emission points.

9. The charged particle beam device according to claim 8, wherein the controlling system controls the scanning deflector and the pulsed beam generation deflector so that the beam is emitted at a distance between emission points specified based on an evaluation of a feature amount of specific regions of a plurality of images having different distances between emission points.

10. The charged particle beam device according to claim 9, wherein the controlling system controls the scanning deflector and the pulsed beam generation deflector at a distance between emission points of the beam at which a brightness value of the specific region is minimum, maximum, equal to or greater than a predetermined threshold, or equal to or less than the predetermined threshold.

11. The charged particle beam device according to claim 7, wherein the controlling system controls a pulsed beam generation deflector that deflects the beam off-axis so that the beam performs scanning at a time between emission points at which a brightness difference of the plurality of specific regions is maximum or equal to or greater than a predetermined threshold.

12. The charged particle beam device according to claim 7, wherein the controlling system controls the scanning deflector and a pulsed beam generation deflector that deflects the beam off-axis so that a plurality of times between emission points are set in a state where the plurality of distances between emission points are set and the beam performs scanning at a combination of a distance between emission points and a time between emission points at which the feature amount of the plurality of specific regions are in the predetermined state.

13. The charged particle beam device according to claim 12, wherein the controlling system controls the scanning deflector and the pulsed beam generation deflector so that the beam performs scanning at a combination of the distance between emission points and the time between emission points at which a brightness difference of the plurality of specific regions is maximum or equal to or greater than a predetermined threshold.

14. The charged particle beam device according to claim 7 further comprising:
one or more processors configured to evaluate a brightness of the specific region based on the output of the detector, wherein
the processor determines a distance between emission points at which the brightness value is maximum based on a relationship between the brightness value of the specific region and the distance between emission points.

15. A computer readable medium configured to store a program instruction executed on a computer system to determine a parameter for controlling a charged particle beam device, wherein
a plurality of images having different distances between emission points when a distance between emission points of a pulsed beam of the charged particle beam device is changed is acquired;
a feature amount of specific regions of the plurality of images having different distances between emission points is evaluated;
a distance between emission points of the beam at which the feature amount is in a predetermined state is specified;
in a state where the specified distance between emission points or a plurality of distances between emission points determined based on the specified distance between emission points are set, a plurality of specific regions included in the plurality of images obtained when time between emission points of the pulsed beam is changed are evaluated; and
a time between emission points at which the feature amount of the plurality of specific regions is in a predetermined state is specified.

16. A charged particle beam device configured to emit a charged particle beam onto a sample, the charged particle beam device comprising:
a charged particle beam emission system including:
a beam column including a scanning deflector that causes a beam to scan the sample and configured to emit the beam that scans the sample with the scanning deflector onto the sample in a pulse manner;
a detector configured to detect a particle obtained by emitting the beam onto the sample; and
a controlling system configured to control the beam column; and
a display device configured to display a control condition of the controlling system, wherein
the display device displays at least information relating to a distance between emission points of the pulsed beam, and the controlling system acquires a plurality of images at one distance between emission points by changing time between emission points of the pulsed beam in a state in which the beam is set to scan the sample at the displayed distance between emission points or at a plurality of distances between emission points using the displayed distance between emission points as a threshold, and specifies a time between emission points at which a feature amount of a specific region included in the plurality of images is in a predetermined state by evaluating the feature amount.

17. A charged particle beam device configured to emit a charged particle beam onto a sample, the charged particle beam device comprising:
a charged particle beam emission system including:
a beam column including a scanning deflector that causes a beam to scan the sample and configured to emit the beam that scans the sample with the scanning deflector onto the sample in a pulse manner;
a detector configured to detect a particle obtained by emitting the beam onto the sample; and
a controlling system configured to control the beam column; and
a display device configured to display a control condition of the controlling system, wherein
the controlling system acquires, by emitting the beam in a state where a plurality of distances between emission points of the pulsed beam or plurality of times between emission points are set, an image for the plurality of distances between emission points or for the plurality of times between emission points, evaluates a feature amount of a plurality of specific regions included in the image, and causes the display device to display information relating to the plurality of feature amounts for the plurality of distances between emission points or the plurality of times between emission points.

18. The charged particle beam device according to claim 17, wherein
the controlling system causes the display device to display a maximum value of the plurality of feature amounts for each distance between emission points.

* * * * *